United States Patent
Yoshizawa et al.

(10) Patent No.: US 7,469,134 B2
(45) Date of Patent: Dec. 23, 2008

(54) MOBILE COMMUNICATION TERMINAL APPARATUS, A VARIABLE GAIN AMPLIFIER CIRCUIT AND A GAIN CONTROL CIRCUIT

(75) Inventors: Atsushi Yoshizawa, Kanagawa (JP); Masahisa Tamura, Kanagawa (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 361 days.

(21) Appl. No.: 10/998,891

(22) Filed: Nov. 29, 2004

(65) Prior Publication Data
US 2005/0136872 A1   Jun. 23, 2005

(30) Foreign Application Priority Data
Dec. 1, 2003   (JP)   ............................... 2003-402317

(51) Int. Cl.
H04B 1/06   (2006.01)

(52) U.S. Cl. ............... 455/234.2; 455/234.1; 455/239.1; 455/136; 455/138; 455/245.1; 375/345; 330/254; 330/279

(58) Field of Classification Search ............... 455/250.1, 455/234.1, 553.1, 231.1, 127.1–127.3, 136, 455/138, 144, 200.1, 219, 232.1, 233.1, 234.2, 455/239.1, 240.1, 241.1, 242.2, 245.1, 245.2, 455/247.1, 251.1, 253.2, 341, 343.1, 343.2, 455/355; 330/279, 254, 278, 129, 131; 375/345
See application file for complete search history.

(56) References Cited

U.S. PATENT DOCUMENTS

| | | | |
|---|---|---|---|
| 5,083,304 A * | 1/1992 | Cahill | ........................ 375/345 |
| 6,088,583 A | 7/2000 | Shimizu et al. | |
| 6,420,934 B1 * | 7/2002 | Butler et al. | ................. 330/279 |
| 6,563,891 B1 | 5/2003 | Eriksson et al. | |
| 6,628,731 B2 * | 9/2003 | Auranen et al. | ............. 375/345 |
| 6,745,016 B2 * | 6/2004 | Iwata et al. | ............... 455/234.1 |
| 7,085,587 B2 * | 8/2006 | Oono et al. | ............... 455/553.1 |
| 7,149,487 B2 * | 12/2006 | Yoshizawa | ............... 455/234.1 |
| 7,194,244 B2 * | 3/2007 | Akamine et al. | ......... 455/250.1 |
| 2002/0142745 A1 | 10/2002 | Kang et al. | |
| 2003/0064696 A1 | 4/2003 | Akamine et al. | |
| 2003/0181179 A1 * | 9/2003 | Darabi | ..................... 455/234.1 |
| 2004/0132420 A1 | 7/2004 | Yoshizawa | |
| 2005/0107054 A1 * | 5/2005 | Nakayama | ............... 455/234.1 |
| 2005/0186927 A1 * | 8/2005 | Hayashi et al. | ........... 455/232.1 |

FOREIGN PATENT DOCUMENTS

EP   1 324 504   7/2003

* cited by examiner

Primary Examiner—Edward Urban
Assistant Examiner—Junpeng Chen
(74) Attorney, Agent, or Firm—Frommer Lawrence & Haug LLP; William S. Frommer; Thomas F. Presson

(57) ABSTRACT

In order to avoid disappearance of output symbols in accompaniment with DC voltage fluctuations occurring at the timing of switching gain in receiving systems for mobile telephones or the like compatible with W-CDMA systems, the present invention provides a variable gain amplifier circuit, a gain control circuit and a mobile communication terminal apparatus, in which a PGA section is comprised of PGAs having different amplification widths continuously arranged in plural stages as in, two coarse adjustment PGAs, a fine adjustment PGA and a coarse adjustment PGA from the input side to the output side; and a gain control circuit has a memory storing a history of gain control with regard to the PGA section and a logic circuit individually controlling gain of each PGA.

7 Claims, 11 Drawing Sheets

| NO | INPUT | | | | OUTPUT | | | |
|---|---|---|---|---|---|---|---|---|
| | IN1 | IN2 | IN3 | IN_M | OUT1 | OUT2 | OUT3 | OUT_M |
| 1 | L | L | L | H | L | L | L | H |
| 2 | L | L | L | L | L | L | L | H |
| 3 | L | L | H | H | L | L | H | H |
| 4 | L | L | H | L | H | L | L | L |
| 5 | H | L | H | H | H | L | H | L |
| 6 | H | L | H | L | H | L | H | L |
| 7 | H | H | H | H | H | H | H | L |
| 8 | H | H | H | L | H | H | H | L |

← L2 (between rows 3 and 4)
← L1 (between rows 4 and 5)

MOBILE COMMUNICATION TERMINAL APPARATUS, A VARIABLE GAIN AMPLIFIER CIRCUIT AND A GAIN CONTROL CIRCUIT

CROSS REFERENCES TO RELATED APPLICATIONS

The present document is based on Japanese Priority Document JP 2003-402317, filed in the Japanese Patent Office on Dec. 1, 2003, the entire contents of which being incorporated herein by reference.

BACKGROUND OF THE INVENTION

1. Field of the Invention

The present invention relates to, for example, a mobile communication terminal apparatus, a variable gain amplifier circuit and a gain control circuit suitable for a mobile telephone compatible with W-CDMA systems, a PHS (Personal Handyphone System) telephone, or a PDA (Personal Digital (Data) Assistant) equipped with a wireless communication function.

2. Description of Related Art

A mobile communication terminal apparatus such as a typical cellular terminal etc. converts an RF received signal received by an antenna to a digital signal using an A/D converter, and provides to audio output and data output via digital signal processing after performing demodulation using a data demodulator. FIG. 9 is a block view showing a typical receive circuit of this kind of mobile communication terminal apparatus.

As shown in the drawings, at the receive circuit, an RF received signal received by an antenna 110 is converted to a baseband signal by an RF circuit 100 in accordance with an RF circuit control signal from a CPU 103. After this, after the baseband signal is converted to a digital signal by an A/D converter 101, and is supplied to a DSP (Digital Signal Processor) 104 via a data demodulator 102 as a digital signal. The signal provided to the DSP 104 is subjected to signal processing on the basis of data stored in memory means 105 such as ROM and RAM etc., and is outputted as audio etc. from output means such as a speaker 109 via a D/A converter 108. After being converted to a digital signal by the A/D converter 106, the audio signal input from a microphone 107 etc. is subjected to signal processing by the DSP and is then transmitted from the antenna 110 via a modulator and a transmission circuit (not shown).

Typically, a dynamic range of the received electric power level at the antenna 110 is 80 dB to 100 dB with a cellular system and an appropriate input level with respect to this is therefore desirable at the A/D converter 101. Namely, the current consumed by an A/D converter increases according to the size of the range to be converted. This means that if the received power level of the antenna is inputted as is to the A/D converter 101, it is necessary for the A/D converter 101 to have an extremely broad dynamic range. Large power consumption is therefore required in accompaniment with this broadening of the range, which effectively reduces the usefulness of a receiver.

A received signal with a level distribution over a broad range is therefore transmitted to the A/D converter 101 at an appropriate level using a so-called automatic gain control circuit (AGC circuit) at this common receiver. This brings about a design of superior effectiveness, as a result, where the dynamic range necessary at the A/D converter 101 is reduced and electrical power consumed at the receiver overall is reduced while only a small amount of electrical power is consumed at the AGC circuit.

Such AGC circuits include typically analog control-type circuits (VGA circuits: Voltage-controlled Gain Amplifiers) for varying voltage supplied as a control signal to control gain. In recent years, however, digital control-type circuits (PGA circuits: Programmable Gain Amplifiers) providing digital data as control signals so as to control gain in a discrete manner have become widely known.

A configuration for a direction conversion receiver (DCR) constituted by an RF circuit performing gain control using this kind of PGA is shown in FIG. 10. At a mixer 113 employing an Ich and a Qch, this DCR performs a direct conversion to a baseband signal using the same local frequency as the frequency received at the antenna 110. Gain is then controlled by a PGA group 114 arranged in a large number of stages.

This kind of DCR can easily be put into the form of a highly integrated IC making it possible to reduce the number of peripheral components and, as a result, particular note has been taken of this receiving method in recent years. With this DCR receiving method, gain switching of the receiver is executed for just a baseband frequency or for an FR frequency and a baseband frequency because in intermediate frequency (IF) is not used. In the example shown in FIG. 10, all gain switching is carried out using baseband signals. Namely, feedback control is performed to apply appropriate gain to baseband signals inputted from the mixer 113 using the four-stage PGA group 114 on the basis of a gain control signal provided by the CPU 103. As a result, it is possible to adjust the signal level outputted to the A/D converter 101.

An example of a typical PGA circuit is shown in FIG. 11. In order to control the PGA group 114, in FIG. 11, first, a so-called three-line data (clock, data, latch) signal is provided to a gain control circuit 115. The gain control circuit 115 then provides prescribed gain control information to the PGA circuits of each stage on the basis of this signal. As an advantage of this kind of PGA circuit is that the change in gain can be discrete, it is possible to use as a variable gain amplifier, for example, a feedback circuit of a negative feedback amplifier for an operational amplifier by switching over with a MOS switch.

It is possible to achieve a receiver at an extremely low price with this method because integration is straightforward using semiconductor circuits. As a result, in a large number of cases, it is possible to achieve a receiver with extremely desirable circuit characteristics with circuits consuming little power, having superior temperature characteristics, and having a broad dynamic range, etc. Further, each PGA is, for example, capable of changing the gain in 1 dB steps using a combination of a resistance value used in an operational amplifier and a switch. Further, arbitrary gain switching such as changing gain from, for example, a minimum gain to a maximum gain in one go using a control signal is also possible.

However, in a case where a PGA circuit is used in this variable gain amplifier, problems occur where an abrupt DC fluctuation is generated at an output terminal at the time of gain switching so that the PGA circuit enters a saturated state. Namely, when the PGA group 114 is controlled to give a large gain, own DC offset voltages of each stage of the PGA group 114 are also amplified. The output DC level therefore reaches a reference voltage level (VDD level) or a ground level (GND level) so that the PGA circuit enters a saturation state. Normal operation of the PGA circuit cannot be expected during this saturation state.

Because of this, a DC feedback circuit 116 as shown in FIG. 11 is provided at this PGA circuit. This DC feedback circuit 116 detects a direct current component (DC component) of an output signal, converts this to a negative phase, and performs addition processing (negative feedback) on an input signal at an adder 117. As a result of this, it is possible to offset the fluctuation component of the own DC offset voltage, the direct current value at the PGA circuit is stabilized, and the inconvenience of the PGA circuit entering the saturated state can be prevented.

In a case where, for example, the baseband circuit for the DCR receiver shown in FIG. 10 is used as a PGA circuit system as shown in FIG. 13, it is necessary to set a cut-off frequency of a low pass filter employed as the DC feedback circuit 116 to an extremely low value. Namely, it is necessary to ensure that dropping of a low-frequency component in a baseband amplifier is avoided in transmission characteristics for a signal from input to output. This is because dropping of the low frequency component in the transmission characteristics from an input signal to an output signal reach a level that is not permissible for a baseband amplifier in a case where the cut-off frequency is not set to an extremely low value.

However, the relationship between the level of the cut-off frequency of the DC feedback circuit 116 and the time constant of the DC feedback circuit 116 is a trade-off. This is to say that there is a problem where the time constant becomes larger as the cut-off frequency is set lower, so that the time until fluctuation in the DC voltage (DC voltage fluctuation) converges, that is, a DC voltage convergence time is delayed.

Namely, although the DC voltage largely fluctuates at this timing if the gain switching is carried out, in a case where the cut-off frequency is set low, a long period of time is required until the this DC voltage fluctuation converges to the original DC voltage. Further, in a case where a PGA gain is switched over from a comparatively low state to the vicinity of maximum gain upon the gain switching, or in a case where the gain is changed at a portion having a substantial influence on the output such as the first stage of a multistage PGA circuit etc., as shown in FIG. 12, the DC level is temporarily saturated, with DC convergence taking place gradually thereafter. As it is not possible to achieve an appropriate output for this DC voltage convergence time, the output signal symbol disappears, and depending on the case, it is possible that deterioration in a bit error rate (BER) may occur.

In order to shorten this DC voltage convergence time, a band switching signal is provided to the DC feedback circuit 116 at the timing of switching the gain as shown in FIG. 14, and control is exerted so as to switch over a cut-off frequency set to a low value up to this point temporarily to a high value cut-off frequency at the time of PGA gain switching. As a result, it is possible to make the DC voltage convergence time shorter as shown in FIG. 15 because it is possible to temporarily reduce the time constant of the DC feedback circuit 116.

A variable gain amplifier system disclosed in Japanese Patent Application Publication (KOKAI) No. 2001-36358 is well-known as a related art of the PGA circuit.

[Japanese Patent Document 1]

Japanese Patent Application Publication (KOKAI) No. 2001-36358.

However, in this method, even if it is possible to shorten the gain switching time, as shown in FIG. 15, instantaneous breaking of the level of the DC voltage fluctuation cannot be avoided, and it is difficult to completely avoid symbols disappearing altogether.

Further, a method of arranging a sample/hold circuit 118 at an output of the PGA group 114 as shown in FIG. 16 has been considered as a method for avoiding instantaneous DC voltage level fluctuation breaking. As shown in FIG. 17, this method is a method where instantaneous breaking of the DC level is suppressed by holding an output and having no output for a certain section.

In this method, even if it is possible to avoid the level breaking using an absence of output, while there is no output, a signal is not outputted, and it is not possible to prevent instantaneous disappearing of the symbols.

Therefore, even if it is possible to shorten the time constant of the feedback circuit or suppress instantaneous saturation by stabilizing the baseband using DC feedback, it is difficult to avoid instantaneous disappearing of a symbol.

An example implementation of a typically used PGA is shown in FIG. 18. In FIG. 18, the variable width of the PGA of the receiver is taken to be 100 dB, with this being covered as 25 dB per one stage using four stages of PGA. PGA1, PGA2 and PGA4 are only for coarse adjustment of fluctuation widths of 25 dB, and PGA3 is a fine adjustment PGA capable of changing in 1 dB widths.

The circuit of the fine adjustment PGA is complex compared to a coarse adjustment PGA. At this time, as shown in FIG. 18, the gain setting of each PGA is decided in accordance with the received signal level and a fixed received power (−20 dBm) can be provided at the A/D input level by performing control using digital data from outside so that this state is attained.

In FIG. 18, change in PGA1 of the first stage is switched from High to Low when the input level is −50 dBm. Changes in the first stage PGA1 are such that changes in the DC offset of PGA1 cause a great amount of amplification to occur in PGA2 onwards of the latter stage. This makes it very easy for DC fluctuation to occur and means that it is easy for the received symbol to disappear.

In a case where this kind of receiver is applied to, for example, mobile communication equipment such as a cellular phone and use in this environment is assumed, as shown in FIG. 19, the AGC performs a following operation at intervals in accompaniment with fluctuations in receive level due to so-called phasing. Because of this, PGA gain changes frequently. At this time, in the event that, for example, changes in gain occur frequently for the first stage (PGA1) of a multistage PGA so that changes in the received power level occur, as with A and B shown in FIG. 20, gain control state transitions occur frequently over a span of −50 dBm, and there is a possibility that the RF output of the receiver will be such that disappearance of symbols will be frequently repeated.

SUMMARY OF THE INVENTION

In order to resolve the aforementioned problems, it is an object of the present invention to provide a mobile communication terminal device, a variable gain amplifier circuit and a gain control circuit capable of preventing disappearance of an output symbol in accompaniment with DC voltage fluctuation occurring at the time of switching gain of a PGA circuit.

The present invention therefore comprises variable gain amplifier means having a plurality of stages of coarse adjustment variable gain amplifiers and fine adjustment variable gain amplifiers arranged consecutively (arranged in series) so as to amplify and output a received signal on the basis of gain controlled by the amplifiers, memory means for storing gain control history of the variable gain amplifier means, and gain control means for controlling gain of the variable gain amplifier means on the basis of signal strength of the received signal and history stored in the memory means, the gain control means individually controlling gain of each variable gain amplifier in such a manner that gain fluctuation frequency of the coarse adjustment variable gain amplifiers arranged on the input side becomes lower than gain fluctuation frequency of other variable gain amplifiers arranged on the output side.

According to the present invention, it is possible to carry out current gain control according to past gain control. For example, when the gain control has a hysteresis characteristic, it is possible to carry out subsequent gain control in an appropriate manner in accordance with whether there is a drastic change in the strength of the received signal, whether there is a small change, or whether the strength of the received signal is increasing or decreasing. Further, because the gain fluctuation frequency of the coarse adjustment variable gain amplifiers arranged on the input side for which substantial DC voltage fluctuations occur easily at the time of gain switching is reduced, it is possible to effectively prevent disappearing of an output symbol in accompaniment with DC voltage fluctuation.

In the present invention, it is preferable for the gain control means to hold a first threshold value and a second threshold value both relating to signal strength, and to control the gain of the variable gain amplifying means in a case where it is determined, on the basis of the history stored in the memory means, that the signal strength exceeds a fluctuation width decided by the first and second threshold values. In this event, it is possible to determine the fluctuation width of the strength of the received signal using the first and second threshold values and to carry out gain control depending on the fluctuation width of the strength of the received signal.

In the present invention, it is preferable for the fluctuation width decided by the first threshold value and the second threshold value to be broader than the fluctuation width of the normalized received signal power obtained from the relationship between a cumulative probability distribution of the received signal and a spreading bandwidth. In this case, it is possible to prevent gain from being switched for changes that occur often on the basis of spreading bandwidth and probability distribution of changes in received signal power.

In the present invention, it is preferable for the memory means to store a fluctuation direction of the received signal strength immediately before gain control as the history. The gain control means also preferably detects fluctuations in the signal strength in stages, acquires the fluctuation direction stored in the memory means, controls gain of the variable gain amplifying means according to the fluctuation stage and the fluctuation direction, and stores the current fluctuation direction in the memory means. In this case, it is possible to minimize storage capacity of the memory means because only the fluctuation direction is stored in the memory means, and it is therefore possible to make the circuit both small in scale and high-speed.

According to the present invention, by reducing the frequency of switching of gain of a PGA circuit, it is possible to reduce disappearance of output symbols in accompaniment with DC voltage fluctuations occurring at the time of switching gain in receiving systems for mobile telephones compatible with W-CDMA systems, PHS telephones, or mobile communication terminals such as PDAs equipped with wireless communication functions.

DETAILED DESCRIPTION OF THE PREFERRED EMBODIMENTS

The present invention is capable of being applied to mobile telephones or PGA circuits compatible with W-CDMA (DS-CDMA) systems.

(Outline of Mobile Telephone Signal Processing)

Figure 1:
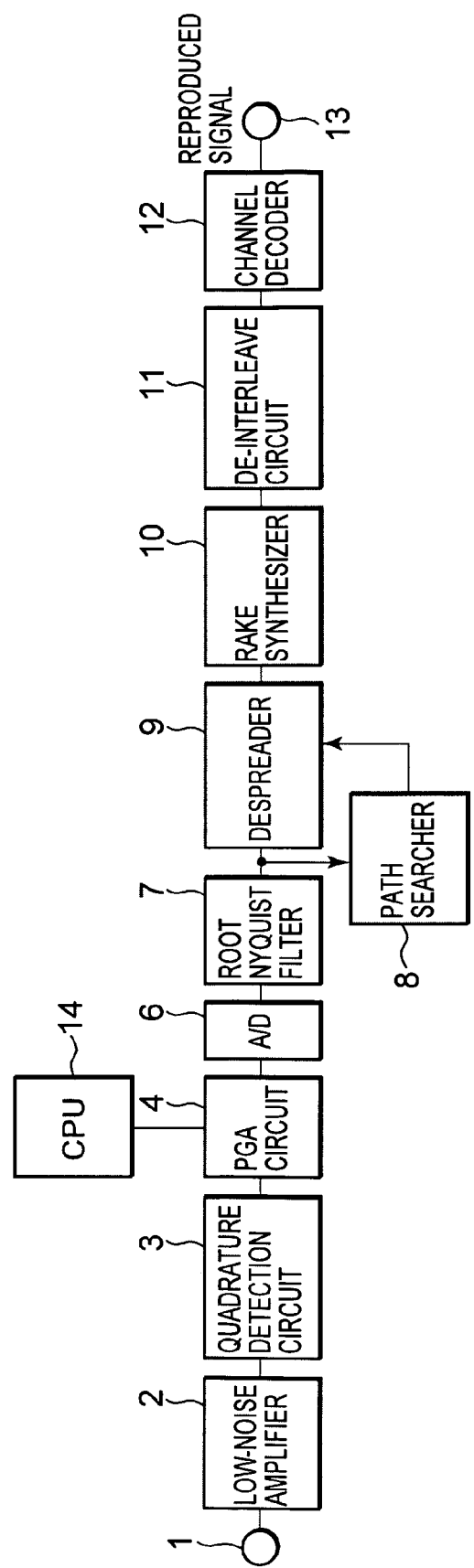
FIG. 1 is a block view showing a configuration of a receiving system for a mobile telephone of an embodiment of the present invention.

FIG. 1 is a block diagram showing a configuration of a receiving system for a mobile phone of an embodiment of the present invention. In FIG. 1, a received signal received by an antenna is amplified by a low-noise amplifier 2 via an input terminal 1. After being converted to an In-phase and a Quadrature-phase of a baseband frequency using a quadrature detection circuit 3, the signal is subjected to linear amplification by a programmable gain amplifier 4 (PGA circuit).

This linear-amplified received signal is digitalized by an A/D converter 6. The digitalized In-phase and Quadrature-phase are subjected to prescribed band limiting processing by a root nyquist filter 7. Further, the band-limited component is then subjected to despreading at a despreader 9 on the basis of a received signal power detected by a path searcher 8, and is time-divided into a plurality of multi-path components of different transmission propagation times.

This time-divided path is then subjected to coherent Rake synthesis processing by a Rake synthesizer 10. The data series after this rake synthesis processing is subjected to de-interleave processing by a de-interleave circuit 11. This is then taken to be a reproduced data series as a result of subjection to channel decode processing (error correction decode processing) by a channel decoder 12. This is then transmitted to an upper layer via an output terminal 13.

(PGA Circuit Configuration)

Figure 2:
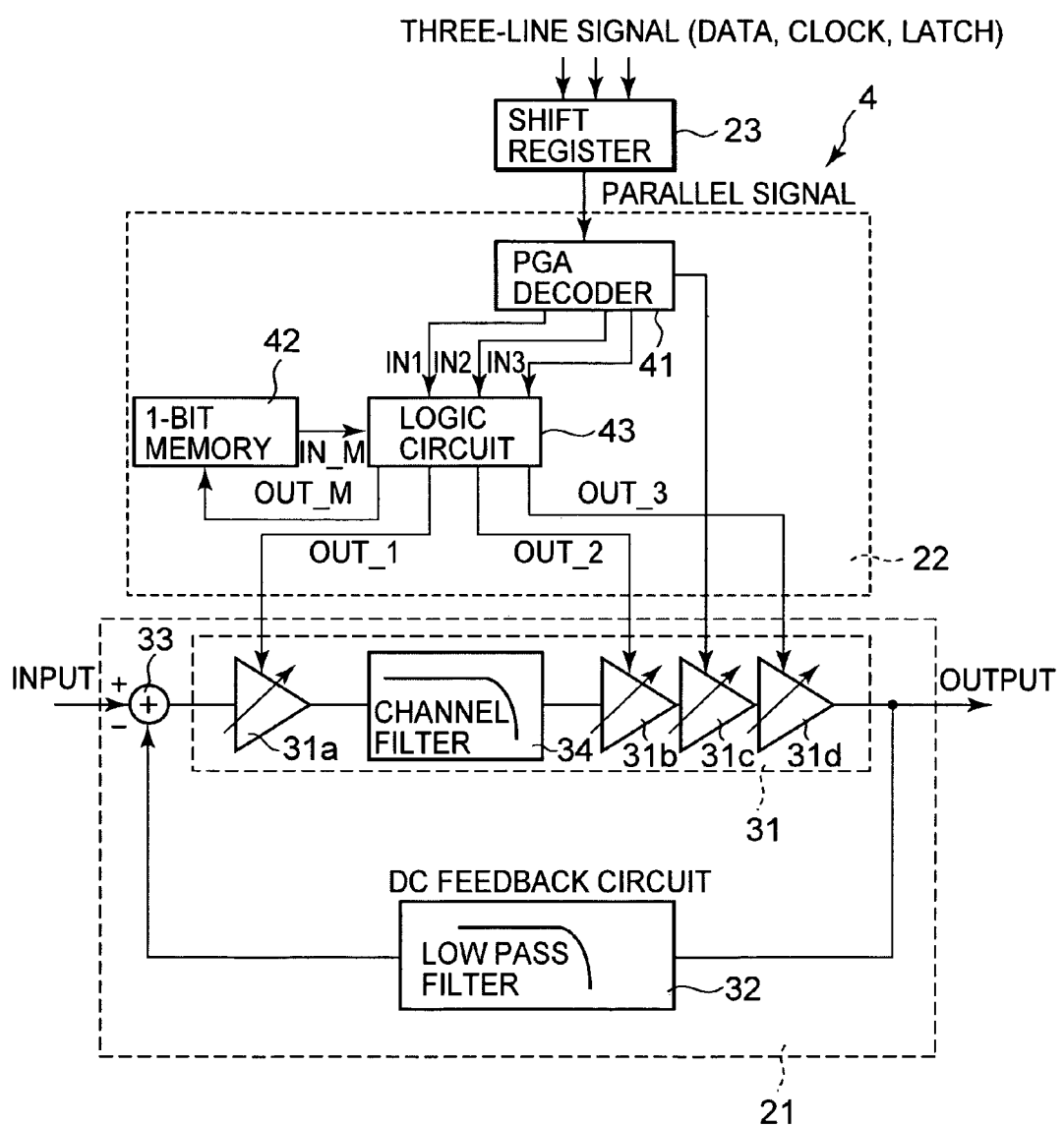
FIG. 2 is a block diagram of a PGA circuit provided in the mobile phone of the embodiment of the present invention.

Next, a block diagram of the PGA circuit 4 is shown in FIG. 2. This PGA circuit 4 is comprised of a variable gain amplifier 21 for amplifying a received signal converted to have a baseband frequency by the quadrature detection circuit 3 using a variably controlled gain and outputting the signal, a gain control circuit 22 for variably controlling gain of the gain control amplifier 21 on the basis of a three-line signal (data signal, clock signal, latch signal), and a shift register 23 for putting serial data (a three-line signal: data signal, clock signal and latch signal) constituting a control signal supplied from a CPU 14 into the form of parallel data for input to the gain control circuit 22.

The variable gain amplifier 21 is comprised of a multi-stage programmable gain amplifier (PGA section) 31 for which gain is controlled by the gain control circuit 22, and a DC feedback circuit 32 for detecting a direct current component of an output signal from the PGA section 31 and converting this to a negative phase for output. Further, the variable gain amplifier 21 is further comprised of an adder 33 for subjecting an orthogonal component of an output signal from the PGA section 31 converted to a negative phase by the DC feedback circuit 32 and a received signal converted to a baseband frequency by the quadrature detection circuit 3 to addition processing so as to form a received signal where fluctuations in the DC component are cancelled out, and supplying this received signal to the PGA section 31.

In this embodiment, the PGA section 31 is a plurality of means that are PGAs having different amplification widths arranged in connection (connected in series) from the input side to the output side as with coarse adjustment PGAs 31a and 31b, fine adjustment PGA 31c, and course adjustment PGA 31d. Each of the PGAs 31a, 31b and 31d is capable of being switched between two types of gain of "High" and "Low" when amplifying the input signal. Further, at the PGA section 31, a channel filter 34 is interposed between the PGA 31a and the PGA 31b.

The gain control circuit 22 is provided with a PGA decoder 41 for decoding the parallel signal inputted from the shift register 23 and distributing this signal to each circuit as a control signal, a logic circuit 43 for controlling the gain of the coarse adjustment PGAs 31a, 31b and 31d according to the control signal inputted from the PGA decoder 41, and memory 42 constituting memory means connected to the logic circuit 43.

The PGA decoder 41 is a circuit for dividing a gain control signal for fine adjustment use from the parallel signal from the shift register 23 and sending this directly to the PGA 31c, and taking the coarse adjustment gain control signals "High" and "Low" as IN1 to IN3 for transmission to the logic circuit 43. The gain combination at the gain control signal inputted to the logic circuit 43 as IN1 to IN3 is typical as shown in FIG. 3 according to the stage of the received signal level.

The memory 42 is memory means for storing history of the gain control with respect to the PGA section 31 by the logic circuit 43. In this embodiment, the gain control immediately before with respect to the PGA section 31 is stored as one bit of data. The logic circuit 43 then determines the direction of fluctuation of the received signal level at the current time occurring at the gain control with respect to the PGA section 31 based on this. Specifically, in a case where "H" is stored in the memory 42, it is determined that the level of the received signal is rising at the time of previous gain control, and it is determined that the received signal level is falling in a case where "L" is stored. In a case where the received signal level reaches an upper limit value and does not exceed this, "L" is stored, and it is determined that the next fluctuation direction is downwards. Further, in a case where the received signal level reaches a lower limit value and does not go below this, "H" is stored, and it is determined that the next fluctuation direction is upwards. This one bit data is inputted to the memory 42 as OUT_M constituting an output of the logic circuit 43 and stored therein, and the stored data is outputted from the memory 42 as IN_M constituting input data with respect to the logic circuit 43.

The logic circuit 43 is gain control means for controlling gain of the PGAs 31a, 31b, and 31d of the PGA section 31 on the basis of IN1 to IN3 inputted from the PGA decoder 41 and the history stored in memory 42 according to the signal strength (received signal level) of the received signal. The logic circuit 43 individually controls the gain of each PGA in such a manner that the gain fluctuation frequency of the coarse adjustment PGA 31a arranged at the input side is lower than the gain fluctuation frequency of the other PGAs 31b to 31d arranged on the output side. This is described in the following.

Figures 3, 4:
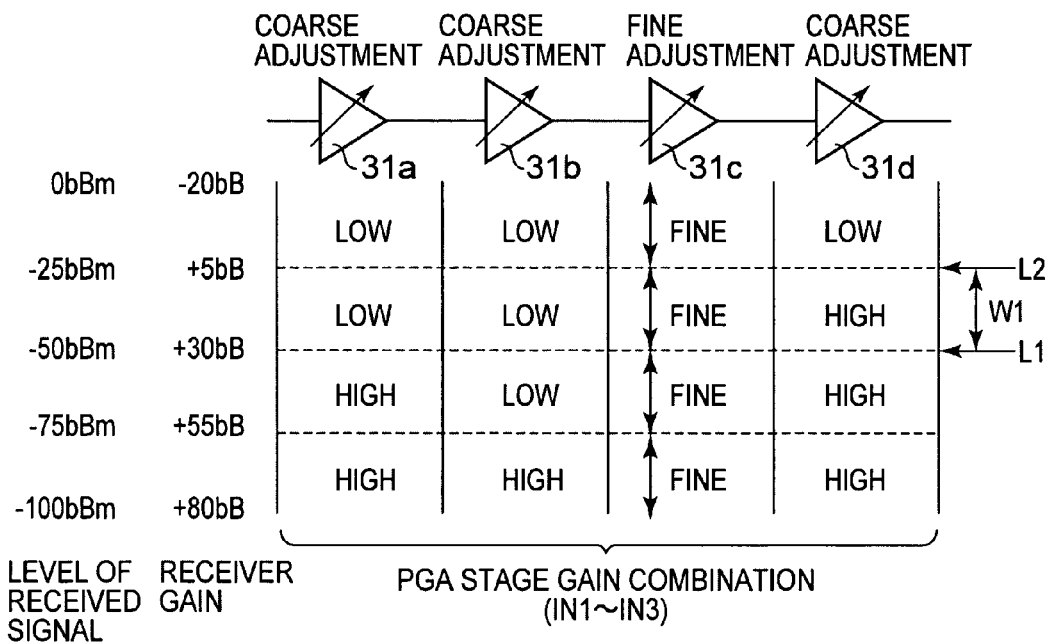
FIG. 3 is an explanatory view showing gain combinations based on IN1-IN3 input to a logic circuit with regard to each stage of the PGA in the embodiment of the present invention.
FIG. 4 is a truth table defining input/output in the logic circuit of the embodiment of the present invention.

This logic circuit 43 controls each PGA of the PGA section 31 in stages according to fluctuation stages of the received signal level as shown in FIG. 3 on the basis of the control signals IN1 to IN3 inputted from the PGA decoder 41. Namely, the logic circuit 43 makes a selection to carry out amplification at a gain of one of the two types of gain of "High" and "Low" according to the stepped received signal level in steps of 25 dB (0 dBm to −25 dBm, −25 dBm to −50 dBm, −75 dBm to −100 dBm), and outputs gain control signals OUT1 to OUT3 to each of the PGAs 31a, 31b and 31d.

While selecting the gain ("High" or "Low") for each PGA, the logic circuit 43 acquires the fluctuation direction ("H" or "L") of the received signal level stored in the memory 42 via IN_M, and controls the gain of the PGA section 31 according to the fluctuation stages (0 dBm to −25 dBm, −25 dBm to −50 dBm, −75 dBm to −100 dBm) and the fluctuation direction ("H" or "L"). Specifically, the logic circuit 43 of this embodiment outputs the outputs OUT1 to OUT3 according to the truth table shown in FIG. 4 on the basis of the inputted IN1 to IN3 and IN_M. The current fluctuation direction ("H" or "L") of the received signal level is acquired and the acquisition results are stored in the memory 42 via the OUT_M.

The logic circuit 43 determines whether or not fluctuation exceeding a fluctuation width w1 has taken place by detecting whether results of continuous rising or falling cause a threshold value L1 or L2 to be exceeded on the basis of the history stored in the memory 42. Namely, in this embodiment, a first threshold value L1 and a second threshold value L2 are decided upon at received signal level fluctuation stages, and the gain of the coarse adjustment PGA 31a is controlled in a case where the received signal level fluctuates to an extent that the fluctuation width w1 decided by the first and second threshold values L1 and L2 is exceeded.

Here, the fluctuation width w1 decided by the first threshold value L1 and the second threshold value L2 is set so as to be broader than a fluctuation width w2 of the normalized received signal power obtained from the relationship between the cumulative probability distribution and the spreading bandwidth of the received signal.

Figure 5:
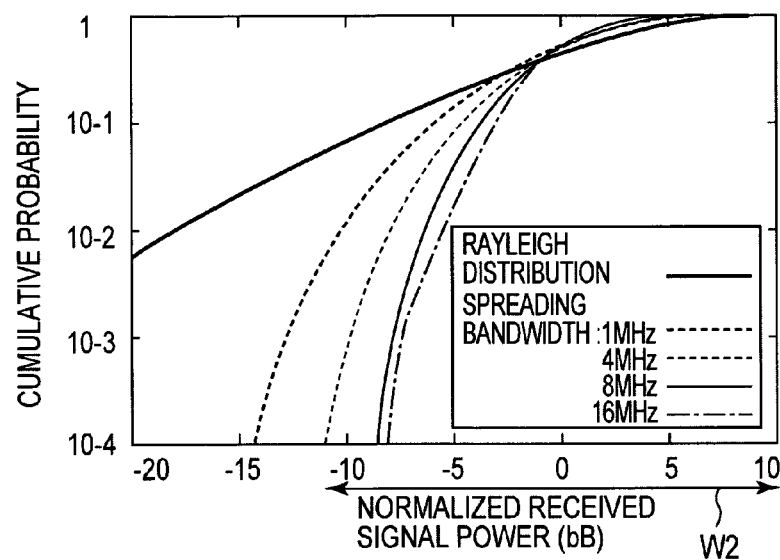
FIG. 5 is a graph showing a cumulative probability distribution of receive power of the embodiment of the present invention.
Figure 6:
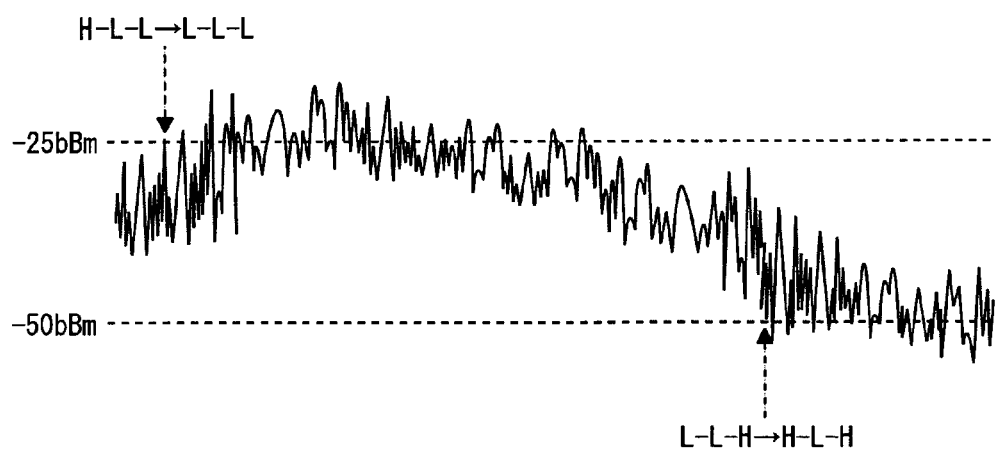
FIG. 6 is a graph showing long-term receive power fluctuation in the embodiment of the present invention.

Typically, regarding the bandwidth of the received signal and the cumulative probability distribution of the received signal power due to phasing, the cumulative probability distribution of the received signal power of the phasing is known to follow a so-called Rayleigh distribution, as shown in FIG. 5. However, when the signal spreading bandwidth is large, a Rayleigh distribution is no longer followed, so that in a case of, for example, 4 MHz W-CDMA, the difference between instantaneous maximum power and minimum power due to phasing, i.e. the fluctuation bandwidth w2 is about 22 dB. Further, as shown in FIG. 6, temporal fluctuations of the received signal power oscillate instantaneously in a range of less than 22 dB, with there being a gradual transition in the long term from −25 dBm (threshold L2) to −50 dBm (threshold value L1). In this embodiment, gain control is carried out at a fluctuation width at an interval of 25 dB that are broader than the 22 dB constituting the fluctuation width w2 of the received signal strength due to phasing, as described above, on the basis of the received signal power.

In this embodiment, the fluctuation band of the received signal power of the WCDMA is assumed to be 4 MHz, and gain control is carried out in the interval of 25 dB but the present invention is by no means limited in this respect, and the gain control steps can also be set according to the system bandwidth.

Figure 8:
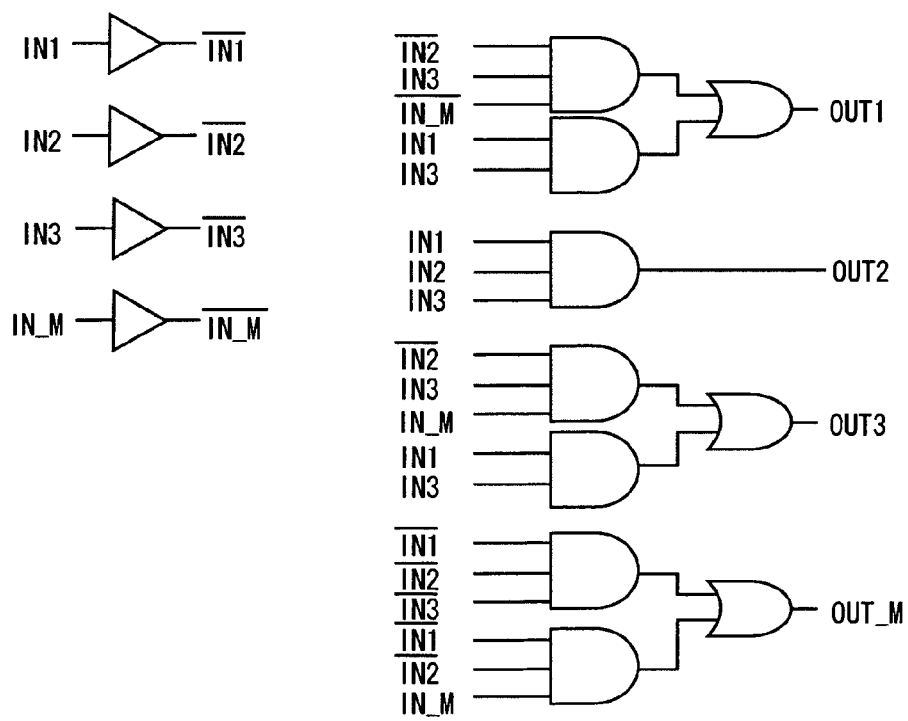
FIG. 8 shows an example circuit of the logic circuit of the embodiment of the present invention.
Figure 9:
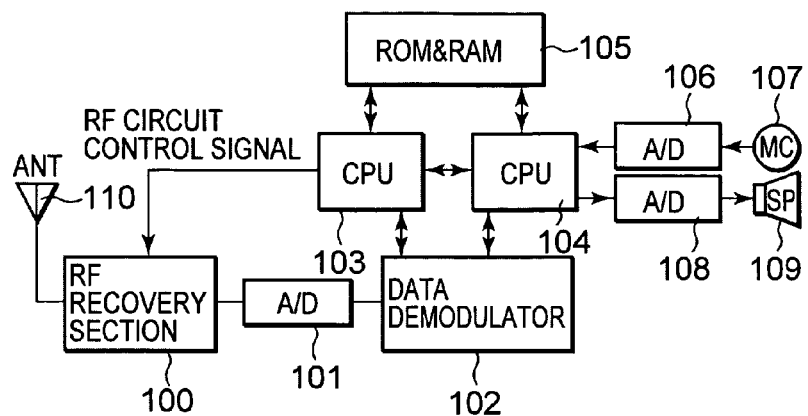
FIG. 9 is a block diagram showing a structure of a receiver provided in a general mobile phone.
Figure 10:
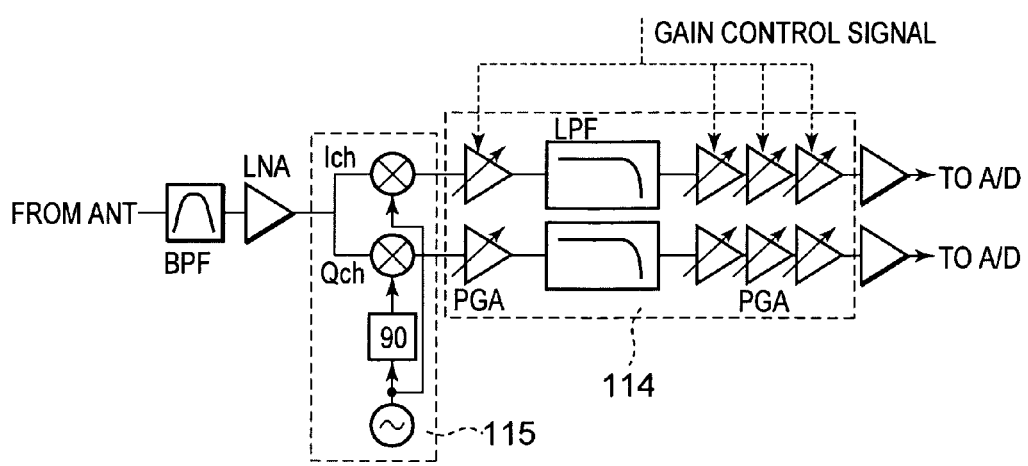
FIG. 10 is a block diagram showing a structure of a general RF circuit.
Figure 11:
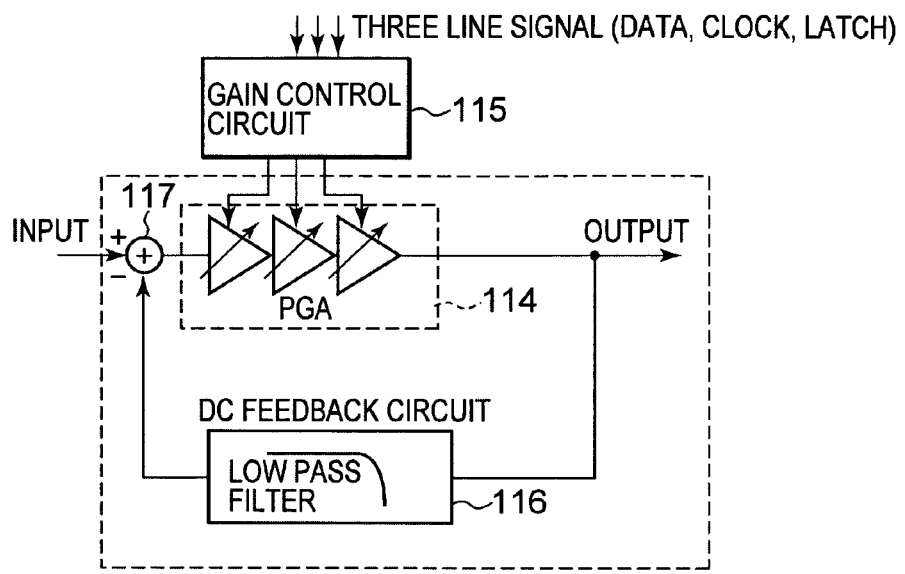
FIG. 11 is a block diagram showing a structure of a general PGA circuit.
Figure 12:
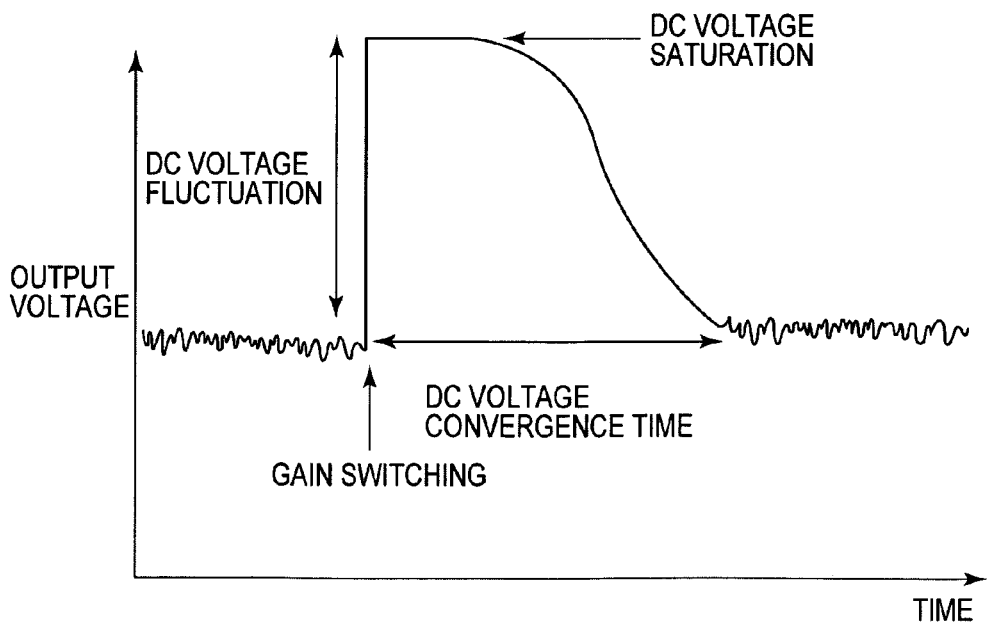
FIG. 12 is a graph showing time-basis change of output DC voltage at the time of general gain switching.
Figure 13:
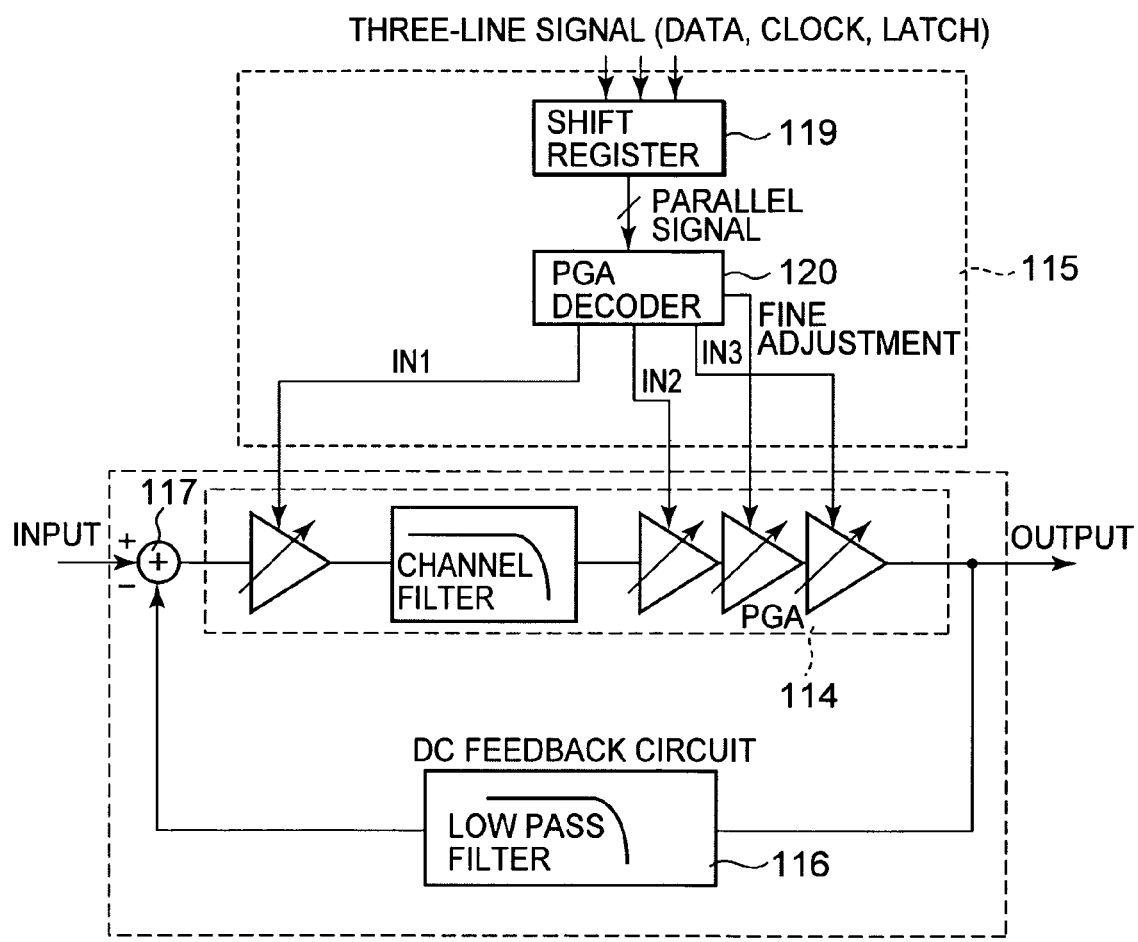
FIG. 13 is a block diagram showing a structure of another general PGA circuit.
Figure 14:
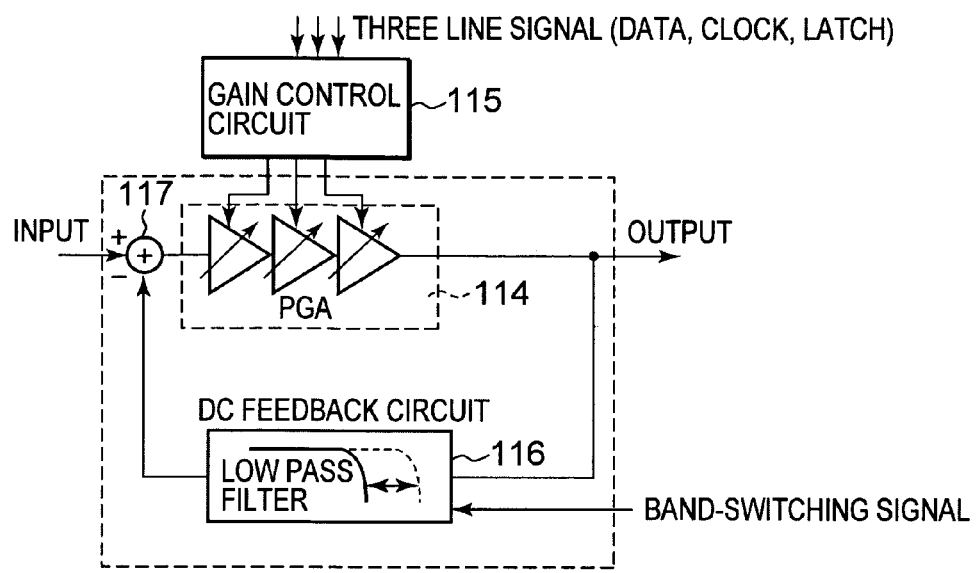
FIG. 14 is a block diagram showing a structure of another general PGA circuit.
Figure 15:
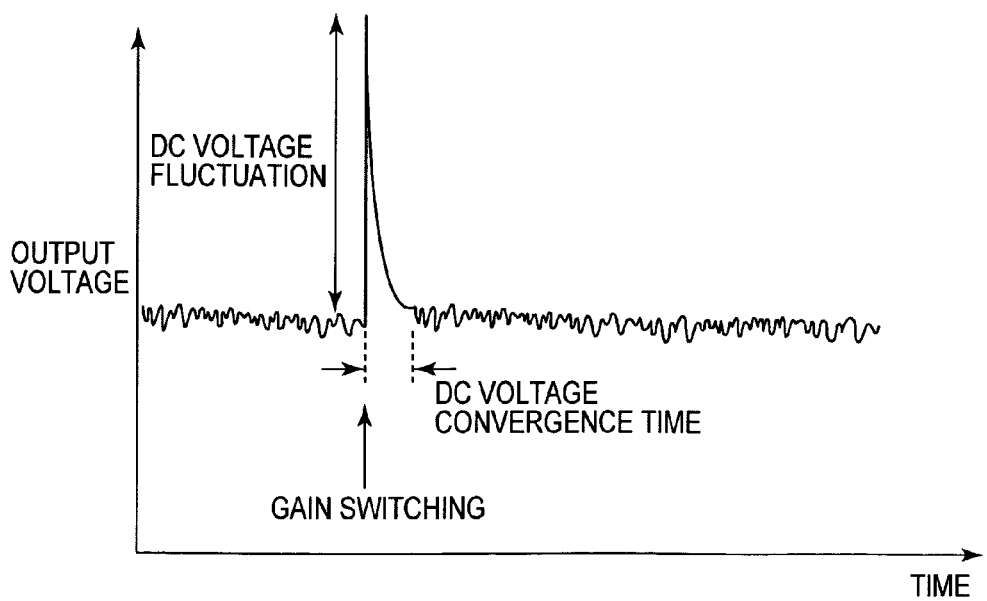
FIG. 15 is a graph showing time-basis change of output DC voltage at the time of general gain switching.
Figure 16:
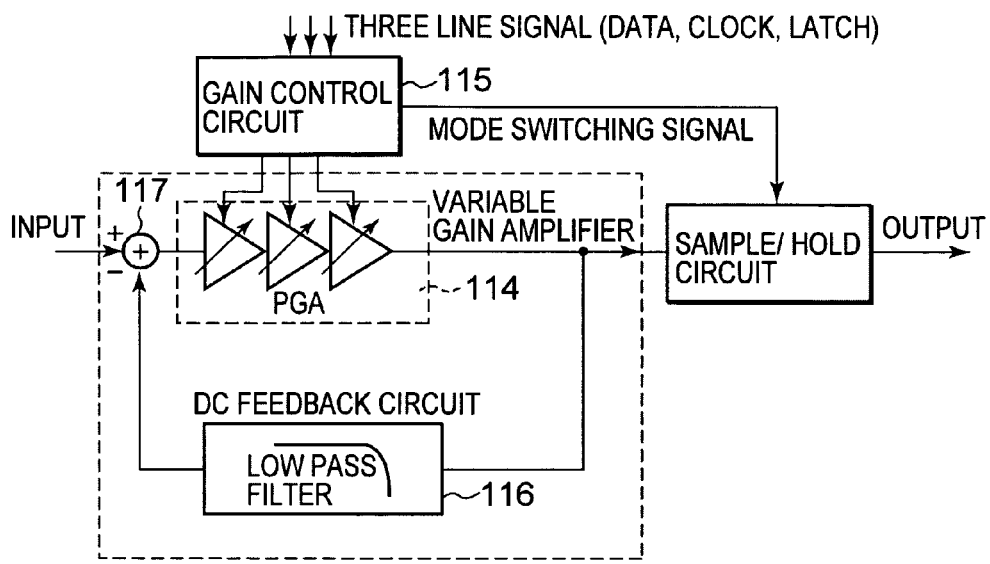
FIG. 16 is a block diagram showing a structure of a general PGA circuit added with a sample/hold circuit.
Figure 17:
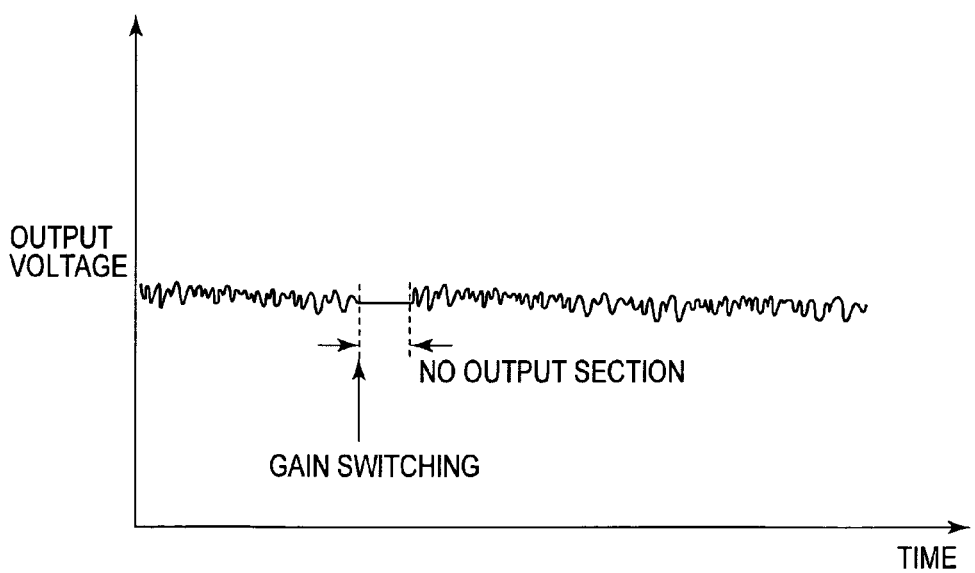
FIG. 17 is a graph showing time-basis change of output DC voltage at the time of general gain switching.
Figure 18:
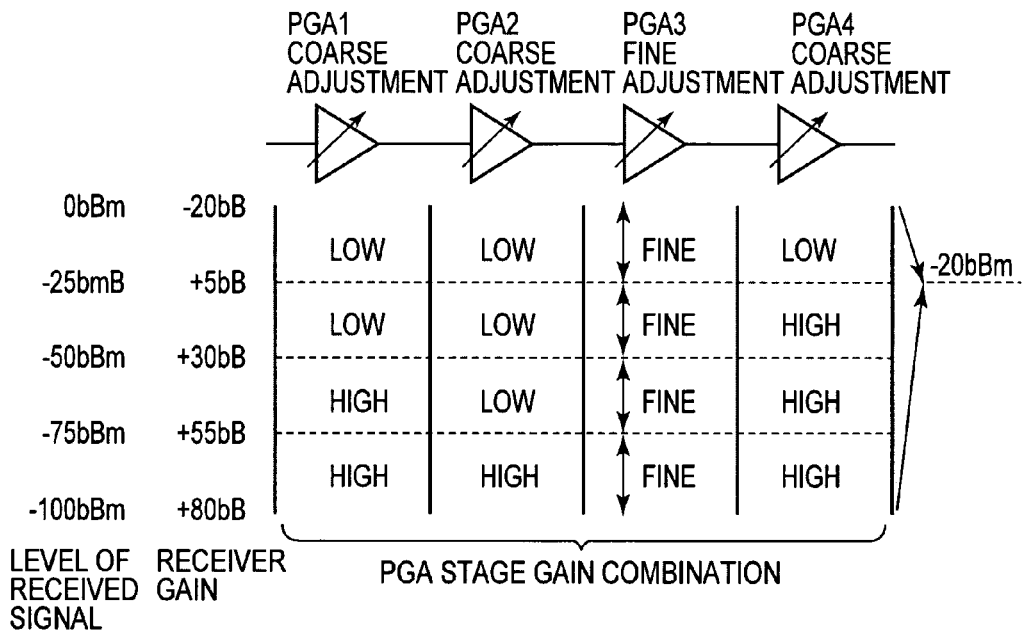
FIG. 18 is an explanatory view showing gain combinations in gain control with regard to each stage of a general PGA group in the embodiment of the present invention.
Figure 19:
FIG. 19 is a graph showing time-basis change of a general receive power level.
Figure 20:
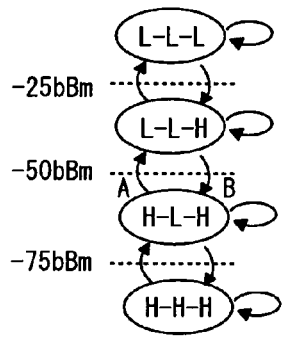
FIG. 20 is a view showing status transition of a general PGA on an input side.

Further, in the present invention, if the logic circuit 43 operates according to the truth table shown in FIG. 4, for example, this can easily be implemented using the logic circuit shown in FIG. 8. The memory 42 may also be cheaply made using, for example, a D-type flip-flop (D-F/F) as an IC circuit together with the logic circuit 43.

(PGA Circuit Operation)

Figure 7:
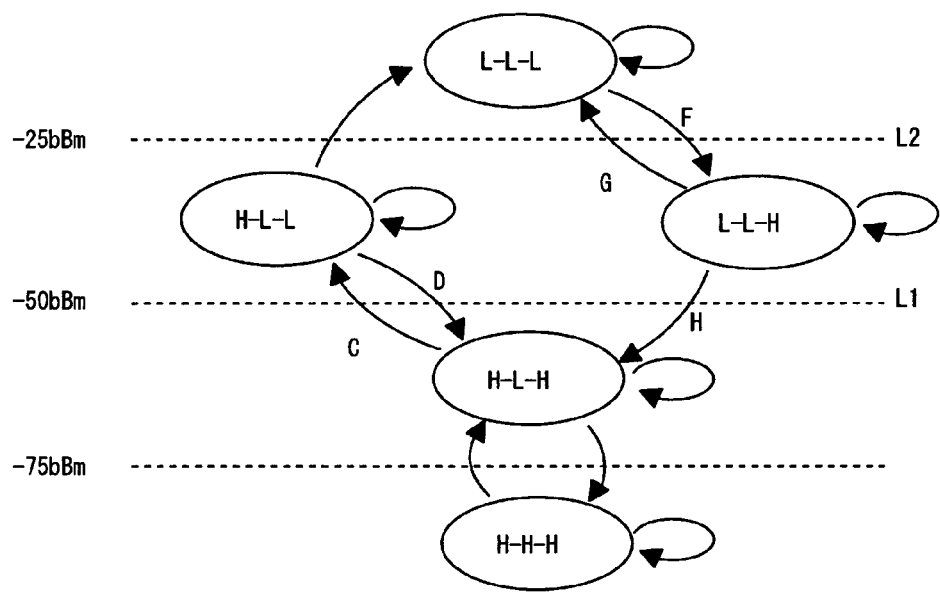
FIG. 7 is a view showing status transition of the PGA on an input side of the embodiment of the present invention.

The operation of the PGA circuit having the configuration described above is now described. FIG. 7 is a state transition view showing gain control by the PGA circuit.

In detail, first, serial data of the three-line signal (data signal, clock signal and latch signal) is supplied to the gain control circuit 22 from the CPU 14. The data signal is sequentially supplied to the shift register 23 on the timing of the clock signal. The gain switching is carried out on the timing of the latch signal. Specifically, the data signal of the shift register 23 is supplied to the PGA decoder 41 in parallel as a gain control signal on the timing of the latch signal. The PGA decoder 41 distributes a fine adjustment control signal and a coarse adjustment control signal to the PGA 31c and the logic circuit 43, respectively.

Next, when control signals IN1 to IN3 are inputted to the logic circuit 43 from the PGA decoder 41, the logic circuit 43 acquires the fluctuation direction ("H" or "L") of the received signal level stored in the memory 42 via the IN_M. The acquired IN1 to IN3 and IN_M are collated with the truth table shown in FIG. 4 and outputted as the outputs OUT1 to OUT3. The logic circuit 43 then stores the fluctuation direction ("H" or "L") of the currently received signal level in the memory 42 via the OUT_M. As a result, it is possible for the gain control to be taken to be a state transition as shown in FIG. 7.

For example, when the current received signal level is in −50 dBm to −75 dBm stage, the control of the gain becomes a state of "H-L-H" (No. 5 or No. 6 in FIG. 4). At this time, "L" is stored in the memory 42. In the next instant, in a case where the received signal level fluctuates to the stage from −25 dBm to −50 dBm (state transition C in FIG. 7), the inputs IN1 to IN3 to the logic circuit 43 become "L-L-H" in accordance with FIG. 3. At this time, the output of the logic circuit 43 becomes "H-L-L" in accordance with No. 4 in FIG. 4 because "L" stored in the memory 42 is inputted to the logic circuit 43 as the IN_M. At this time, "L" is stored in the memory 42 in accordance with No. 4 in FIG. 4.

Further, in the following instant, in a case where the received signal level fluctuates to the stage from 0 dBm to −25 dBm (state transition E in FIG. 7), the inputs IN1 to IN3 to the logic circuit 43 become "L-L-L" in accordance with FIG. 3. At this time, "L" stored in the memory 42 is inputted to the logic circuit 43 as the IN_M. The output of the logic circuit 43 becomes "L-L-L" in accordance with No. 2 in FIG. 4. As a result, the gain of the coarse adjustment PGA 31a on the input side can be switched from "High" to "Low". At this time, "H" is stored in the memory 42 in accordance with No. 2 in FIG. 4.

Moreover, in a case where the received signal level fluctuates from a state "L-L-L" at this stage from 0 dBm to −25 dBm to the stage from −25 dBm to −50 dBm (state transition F in FIG. 7), the inputs IN1 to IN3 to the logic circuit 43 become "L-L-H" in accordance with FIG. 3. At this time, the output of the logic circuit 43 becomes "L-L-H" in accordance with No. 3 in FIG. 4 because "H" stored in the memory 42 is inputted to the logic circuit 43 as the IN_M. As a result, the gain of the coarse adjustment PGA 31a on the input side is not switched over. At this time, "H" is stored in the memory 42 in accordance with No. 3 in FIG. 4.

Moreover, in a case where the received signal level rises again from a state "L-L-H" to the stage from 0 dBm to −25 dBm (state transition G in FIG. 7), the inputs IN1 to IN3 to the logic circuit 43 become "L-L-L" in accordance with FIG. 3. At this time, "H" stored in the memory 42 is inputted to the logic circuit 43 as the IN_M. The output of the logic circuit 43 becomes "L-L-L" in accordance with No. 1 in FIG. 4. As a result, the gain of the coarse adjustment PGA 31a on the input side is not switched over. At this time, "H" is stored in the memory 42 in accordance with No. 1 in FIG. 4.

On the other hand, in a case where the received signal level falls from a state "L-L-H" to the stage from −50 dBm to −75 dBm (state transition H in FIG. 7), the inputs IN1 to IN3 to the logic circuit 43 become "H-L-H" in accordance with FIG. 3. At this time, "H" stored in the memory 42 is inputted to the logic circuit 43 as the IN_M. The output of the logic circuit 43 becomes "H-L-H" in accordance with No. 5 in FIG. 4. As a result, the gain of the coarse adjustment PGA 31a on the input side can be switched from "Low" to "High". At this time, "L" is stored in the memory 42 in accordance with No. 5 in FIG. 4.

As a result of the above, the gain of the PGA 31a is switched over only when the received signal level continuously exceeds the threshold levels L1 and L2, i.e. when the received signal level is of a fluctuation width exceeding the fluctuation width w1 (state transitions E and H in FIG. 7).

(Effects of PGA Circuit and Mobile Telephone Equipped with this PGA Circuit)

According to the PGA circuit and the mobile telephone equipped with this circuit, as described above, the fluctuation width w1 decided by the first threshold value L1 and the second threshold value L2 is set at the interval of 25 dB broader than the 22 dB constituting the fluctuation width w2 in received signal strength due to phasing. Temporal fluctuations in the received signal power make a smooth transition over long periods in going from −25 dBm (threshold value L2) to −50 dBm (threshold value L1). It is therefore possible to drastically reduce the frequency of the gain fluctuation of the PGA 31a on the input side.

As described above, temporal fluctuations of the received signal level oscillate instantaneously in a range of less than 22 dB, with there being a gradual transition in the long term from −25 dBm (threshold L2) to −50 dBm (threshold value L1). State transitions crossing over from −25 dBm to −50 dBm as for E or H in the transition view of FIG. 7 therefore only take place at timings shown by the arrows in FIG. 6. The gain combination at the timing shown by this arrow then changes from "H-L-L" to "L-L-L" or from "L-L-H" to "H-L-H" and a change in gain of the PGA 31a on the input side occurs. However, after the received signal level exceed the threshold values L1 or L2 once, then the state transitions of G and F or C and D in FIG. 7 take place and change in gain of the PGA 31a on the input side does not occur. As a result, the frequency of gain fluctuation of the PGA 31a is drastically reduced.

As a result, according to this embodiment, it is possible to drastically reduce the frequency of substantial fluctuations in the DC voltage value occurring at the time of changing gain on the input side by reducing the fluctuation frequency in gain of the PGA 31a on the input side. It is therefore possible to avoid the disappearance of an output symbol in accompaniment with fluctuations in DC voltage occurring at the timing of switching the gain of the PGA circuit.

Further, according to this embodiment, it is possible to improve the stability of operation of a back-end circuit such as the A/D converter 6 etc. arranged at a latter stage of the PGA circuit, and improvement in the stability of the AGC group can be anticipated. Further, by increasing the stability of the back-end circuit, it is possible to reduce delaying of the AGC loop convergence process and to increase the speed of the AGC attack time.

Further, in this embodiment, the three signals (IN1 to IN3) inputted to the gain control circuit 22 are a gain combination as in the related art and are converted into gain control signals (OUT1 to OUT3) for reducing the frequency of gain control of the input side PGA as a result of processing occurring at the logic circuit 43 and the memory 42. It is therefore possible to implement the present invention without adding changes to other peripheral devices such as the CPU 14 etc. simply by adding a gain control circuit 22 to an existing device. The above-described embodiment is merely an example of the present invention.

This is to say that the present invention is by no means limited by the aforementioned embodiment, and that various modifications may be made according to the design etc. without deviating from the scope of the technological concept of the present invention even for embodiments other than those described above.

What is claimed is:

1. A mobile communication terminal apparatus comprising:
  variable gain amplifying means having a plurality of coarse adjustment variable amplifying sections and fine adjustment variable gain amplifying sections, to which at least one received signal is inputted, and amplifying the inputted received signal with controlled gain for output;
  memory means for storing a history of gain control with regard to said variable gain amplifying means; and
  gain control means for controlling the gain of said variable gain amplifying means on the basis of signal strength of said received signal and the history stored in said memory means,
  wherein: said gain control means individually controls gain of each variable gain amplifying section in such a manner that gain fluctuation frequency of said coarse adjustment variable gain amplifying section arranged on an input side becomes lower than gain fluctuation frequency of other variable gain amplifying section arranged on an output side,
  wherein said gain control means holds a first threshold and a second threshold with regard to said signal strength, and on the basis of the history stored in said memory means, in a case where said signal strength is determined to fluctuate exceeding a first fluctuation width determined by said first and second thresholds, controls gain of said coarse adjustment variable gain amplifying section, and
  wherein the first threshold and the second threshold is predetermined so that the first fluctuation width between the first threshold and the second threshold is larger than a second fluctuation width of a normalized received signal power obtained from a relationship between a cumulative probability distribution and a spreading bandwidth of the received signal.

2. The mobile communication terminal apparatus as claimed in claim 1,
  wherein said memory means to store a fluctuation direction of said signal strength immediately before gain control as the history, and said gain control means also preferably detects fluctuations in said signal strength in stages, acquires said fluctuation direction stored in said memory means, controls gain of said variable gain amplifying means according to a fluctuation stage and the fluctuation direction, and stores a current fluctuation direction in said memory means.

3. A variable gain amplifying circuit comprising:
  variable gain amplifying means having a plurality of coarse adjustment variable amplifying sections and fine adjustment variable gain amplifying sections, to which at least one received signal is inputted, and amplifying the inputted received signal with controlled gain for output;
  memory means for storing a history of gain control with regard to said variable gain amplifying means; and
  gain control means for controlling the gain of said variable gain amplifying means on the basis of signal strength of said received signal and the history stored in said memory means, wherein: said gain control means individually controls gain of each variable gain amplifying section in such a manner that gain fluctuation frequency of said coarse adjustment variable gain amplifying section arranged on an input side becomes lower than gain fluctuation frequency of other variable gain amplifying section arranged on an output side,
  wherein: said gain control means holds a first threshold and a second threshold with regard to said signal strength, and on the basis of the history stored in said memory means, in a case where said signal strength is determined to fluctuate exceeding a first fluctuation width determined by said first and second thresholds, controls gain of said coarse adjustment variable gain amplifying section, and
  wherein the first threshold and the second threshold is predetermined so that the first fluctuation width between the first threshold and the second threshold is larger than a second fluctuation width of a normalized received signal power obtained from a relationship between a cumulative probability distribution and a spreading bandwidth of the received signal.

4. The variable gain amplifying circuit as claimed in claim 3,
  wherein said memory means stores a fluctuation direction of said signal strength immediately before gain control as the history, and said gain control means detects fluctuations in said signal strength in stages, acquires said fluctuation direction stored in said memory means, controls gain of said variable gain amplifying means according to a fluctuation stage and the fluctuation direction, and stores a current fluctuation direction in said memory means.

5. A gain control circuit for controlling gain of variable gain amplifying means having a plurality of coarse adjustment variable amplifying sections and fine adjustment variable gain amplifying sections, to which at least one received signal is inputted, and amplifying the inputted received signal with controlled gain for output, comprising:
  memory means for storing a history of gain control with regard to said variable gain amplifying means; and
  gain control means for controlling the gain of said variable gain amplifying means on the basis of signal strength of said received signal and the history stored in said memory means, wherein: said gain control means individually controls gain of each variable gain amplifying section in such a manner that gain fluctuation frequency of said coarse adjustment variable gain amplifying section arranged on an input side becomes lower than gain fluctuation frequency of other variable gain amplifying section arranged on an output side,
  wherein: said gain control means holds a first threshold and a second threshold with regard to said signal strength, and on the basis of the history stored in said memory means, in a case where said signal strength is determined to fluctuate exceeding a first fluctuation width determined by said first and second thresholds, controls gain of said coarse adjustment variable gain amplifying section, and
  wherein the first threshold and the second threshold is predetermined so that the first width between the first threshold and the second threshold is larger than a second fluctuation width of a normalized received signal power obtained from a relationship between a cumulative probability distribution and a spreading bandwidth of the received signal.

6. A variable gain amplifying circuit comprising:
  a variable gain amplifying section having a plurality of coarse adjustment variable amplifiers and fine adjustment variable gain amplifiers, to which at least one received signal is inputted, and amplifying the inputted received signal in accordance with a control signal for controlling gain for output;
  a memory for storing a history of gain control with regard to said variable gain amplifying means; and
  a gain control circuit for controlling the gain of said variable gain amplifier on the basis of signal strength of said received signal and the history stored in said memory,
  wherein said gain control circuit individually controls gain of each variable gain amplifier in such a manner that gain fluctuation frequency of said coarse adjustment variable gain amplifier arranged on an input side becomes lower than gain fluctuation frequency of other variable gain amplifier arranged on an output side,
  wherein said gain control means holds a first threshold and a second threshold with regard to said signal strength, and on the basis of the history stored in said memory means, in a case where said signal strength is determined to fluctuate exceeding a first fluctuation width determined by said first and second thresholds, controls gain of said coarse adjustment variable gain amplifying section, and
  wherein the first threshold and the second threshold is predetermined so that the first fluctuation width between the first threshold and the second threshold is larger than a second fluctuation width of a normalized received signal power obtained from a relationship between a cumulative probability distribution and a spreading bandwidth of the received signal.

7. A mobile communication terminal apparatus comprising:
  a variable gain amplifying section having a plurality of coarse adjustment variable amplifiers and fine adjustment variable gain amplifiers, to which at least one received signal is inputted, and amplifying the inputted received signal in accordance with a control signal for controlling gain for output;
  a memory for storing a history of gain control with regard to said variable gain amplifying means; and
  a gain control circuit for controlling the gain of said variable gain amplifier on the basis of signal strength of said received signal and the history stored in said memory, wherein: said gain control circuit individually controls gain of each variable gain amplifier in such a manner that gain fluctuation frequency of said coarse adjustment variable gain amplifier arranged on an input side becomes lower than gain fluctuation frequency of other variable gain amplifier arranged on an output side,
  wherein: said gain control means holds a first threshold and a second threshold with regard to said signal strength, and on the basis of the history stored in said memory means, in a case where said signal strength is determined to fluctuate exceeding a first fluctuation width determined by said first and second thresholds, controls gain of said coarse adjustment variable gain amplifying section, and
  wherein the first threshold and the second threshold is predetermined so that the first fluctuation width between the first threshold and the second threshold is larger than a second fluctuation width of a normalized received signal power obtained from a relationship between a cumulative probability distribution and a spreading bandwidth of the received signal.

* * * * *